US006835424B2

(12) United States Patent
Larson, Jr. et al.

(10) Patent No.: US 6,835,424 B2
(45) Date of Patent: Dec. 28, 2004

(54) MARKING SUBSTRATES

(75) Inventors: Richard J. Larson, Jr., Walpole, NH (US); Michael P. Secord, Winchester, NH (US); Richard C. Woudenberg, Jr., Keene, NH (US)

(73) Assignee: Markem Corporation, Keene, NH (US)

( * ) Notice: Subject to any disclaimer, the term of this patent is extended or adjusted under 35 U.S.C. 154(b) by 0 days.

(21) Appl. No.: 10/378,406

(22) Filed: Mar. 3, 2003

(65) Prior Publication Data

US 2003/0203122 A1 Oct. 30, 2003

Related U.S. Application Data

(63) Continuation of application No. 09/855,916, filed on May 15, 2001.

(51) Int. Cl.$^7$ ................................................. B05D 3/06
(52) U.S. Cl. ...................... 427/553; 427/387; 427/554; 427/555; 427/556; 428/447; 528/29; 528/34; 528/38; 528/43; 524/82; 524/84; 524/86; 524/95; 524/107; 106/31.01
(58) Field of Search ................................ 427/553, 554, 427/555, 556, 387; 428/447; 528/29, 34, 38, 43; 524/82, 84, 86, 95, 107; 106/31.01, 31.06

(56) References Cited

U.S. PATENT DOCUMENTS

| | | | |
|---|---|---|---|
| 2,605,194 A | 7/1952 | Smith et al. | |
| 2,732,320 A | 1/1956 | Guillissen et al. | |
| 3,214,285 A | 10/1965 | Wissinger et al. | |
| 3,396,401 A | 8/1968 | Nonomura | |
| 3,657,510 A | * 4/1972 | Rothrock | 219/121.11 |
| 3,852,097 A | 12/1974 | Owen et al. | |
| 3,951,060 A | 4/1976 | Crystal | |
| 3,975,554 A | 8/1976 | Kummins et al. | |
| 3,995,554 A | 12/1976 | Wells | |
| 4,113,665 A | 9/1978 | Law et al. | |
| 4,150,191 A | 4/1979 | Karki | |
| 4,307,282 A | 12/1981 | Gappa | |
| 4,370,370 A | 1/1983 | Iwata et al. | |
| 4,444,973 A | 4/1984 | Schonfelder et al. | |
| 4,446,169 A | 5/1984 | Castle et al. | |
| 4,461,807 A | 7/1984 | Mori et al. | |
| 4,546,045 A | 10/1985 | Elias | |
| 4,587,203 A | 5/1986 | Brault et al. | |
| 4,749,764 A | 6/1988 | Koerner et al. | |
| 4,806,391 A | 2/1989 | Shorin | |
| 4,855,348 A | 8/1989 | Strader | |
| 4,898,772 A | 2/1990 | Priesch et al. | |
| 5,196,227 A | 3/1993 | Ogawa et al. | |
| 5,196,228 A | 3/1993 | Kirby et al. | |
| 5,254,525 A | 10/1993 | Nakajima et al. | |
| 5,275,645 A | 1/1994 | Ternoir et al. | |
| 5,422,167 A | 6/1995 | Robertson et al. | |
| 5,426,168 A | 6/1995 | Witucki | |
| 5,484,099 A | 1/1996 | Robertson et al. | |
| 5,626,966 A | 5/1997 | Kulper et al. | |
| 5,760,155 A | 6/1998 | Mowrer et al. | |
| 5,827,590 A | 10/1998 | Morita et al. | |
| 5,855,969 A | 1/1999 | Robertson | |
| 5,856,267 A | 1/1999 | Sherman et al. | |
| 5,939,491 A | 8/1999 | Wilt et al. | |
| 5,973,044 A | 10/1999 | Lutz et al. | |
| 5,998,560 A | 12/1999 | Decker et al. | |
| 6,001,459 A | 12/1999 | Mahn, Jr. | |
| 6,132,547 A | 10/2000 | Marsh | |
| 6,168,853 B1 | 1/2001 | Feng et al. | |
| 6,187,863 B1 | 2/2001 | Wilt et al. | |
| 6,187,891 B1 | 2/2001 | Rautschek et al. | |
| 6,451,421 B1 * | 9/2002 | Robertson et al. | ....... 428/315.5 |

FOREIGN PATENT DOCUMENTS

| | | | |
|---|---|---|---|
| EP | 0 720 921 A1 | 7/1996 | |
| EP | 720921 A1 * | 7/1996 | ............ B41M/5/26 |
| EP | 0716135 B1 | 9/1999 | |
| GB | 920414 | 3/1963 | |
| JP | 02211278 A | 8/1990 | |
| JP | 06191159 A * | 7/1994 | ............ B41M/5/26 |

OTHER PUBLICATIONS

Abate, "Silicone Resin Emulsions for High Temperature Coatings", Modern Paint and Coatings, Sep. 1993, pp. 62–67.*

Weng, S.; Mun, S.; Cheong, S.; Leong, S.; Kwong, L.; "Silane Coupling Agents", Silane Cross–linking Agents, Nov. 2000, pp. 1–14 Website: http://www.sinrubtech.com/short%20notes/Short%20Notes%205.1.htm.

Soraru, Gian Domenico; "Silicon Oxycarbide Glasses from Gels", Journal of Sol–Gel Science and Technology, 2, 843–848 (1994), Kluwer Academic Publishers, Boston.

Silicon, Germanium, Tin and Lead Compounds, Metal Alkoxides, Diketonates and Carboxylates, A Survey of Properties and Chemistry, Gelest, Inc. 1998, $2^{nd}$ edition, p. 483–498.

Bevington, John C.; Allen, Sir Geoffrey; "Comprehensive Polymer Science: The Synthesis, Characterization, Reactions and Applications of Polymers", Oxford: New York: Pergamon Press, 1989, $1^{st}$ ed. P. 593–609.

"Silane Coupling Agents" from http://www.sinrubtech.com/short%20notes/Short%20Notes%205.1.htm.

* cited by examiner

Primary Examiner—Margaret G. Moore
Assistant Examiner—Marc S Zimmer
(74) Attorney, Agent, or Firm—Fish & Richardson P.C.

(57) ABSTRACT

A marking composition includes a polymerizable first material that comprises silicon and a second material capable of extending polymeric chains of the first material, wherein the marking composition is capable of undergoing a change that can be detected optically when the composition is contacted with energy.

37 Claims, 6 Drawing Sheets

MARKING SUBSTRATES

CROSS-REFERENCE TO RELATED APPLICATIONS

This application is a continuation application of and claims priority to U.S. application Ser. No. 09/855,916, filed on May 15, 2001, hereby incorporated by reference in its entirety.

BACKGROUND

This invention relates to marking substrates.

One technique for marking substrates is known as laser marking. In laser marking, radiation is directed onto a substrate to modify the substrate, or a coating on the substrate, in a way that induces a change in the substrate or coating that can be detected optically. For example, the substrate may be aluminum beverage cans that are oriented such that the radiation can be directed to the bottom of the can for marking indicia. The radiation can be directed, or addressed, in a pattern over the substrate such that a desired image is rendered.

SUMMARY

The invention relates to marking substrates. For example, the substrate can be a coating, such as a laser sensitive coating, that can be applied on a beverage can, such as on the bottom or the neck of the can, for marking indicia such as date codes, lot numbers, promotional indicia, graphics, and sell by dates. In addition, the substrate can also be used for identification of parts, such as automotive parts, e.g., oil filters, two-piece cans, three-piece cans, aerospace parts, and saw blades.

In one aspect, the invention features a marking composition including a polymerizable first material that comprises silicon, and a second material capable of extending polymeric chains of the first material, wherein the marking composition is capable of undergoing a change that can be detected optically when the composition is contacted with energy.

Embodiments include one or more of the following features. The second material is capable of crosslinking with the first material. The second material includes a polyol, e.g., a diol and/or a triol. The first material includes a silicone resin, e.g., one that includes a combined aromatic and aliphatic substituted silicone resin. The first material includes a phenyl methyl silicone resin. The ratio of phenyl to methyl groups is between about 0.4:1 and 2.1:1. The composition further includes a crosslinking agent, e.g., a silane. The composition further includes a blocked crosslinking agent, e.g., a carbamate. The composition further includes a catalyst, e.g., a platinum-based catalyst, a zinc-based catalyst, and/or a Lewis acid. The composition further includes an optical tag.

In another aspect, the invention features a marking composition, including a polymerizable silicone resin, a crosslinking agent capable of crosslinking with the resin, and a polyol capable of extending polymeric chains of the silicone resin, wherein the marking composition is capable of undergoing a change that can be detected optically when the composition is contacted with energy.

In some embodiments, the composition includes about 10 to about 90 percent of the resin, about 0.1 to about 9 percent of the crosslinking agent, and about 1 to about 10 percent of the polyol.

In another aspect, the invention features a method of marking a substrate. The method includes contacting the substrate with a composition having a polymerizable first material that comprises silicon, and a second material capable of extending chains of the first material, and contacting the composition with energy to produce a change in the composition that can be detected optically.

Embodiments include one or more of the following features. The first material comprises a silicone resin and the second material comprises a polyol. The method further includes curing the composition. The method further includes contacting the substrate with a second composition comprising a crosslinking agent. The crosslinking agent includes a silane. The substrate can be a beverage can. Contacting the composition with energy includes forming a marking indicative of a date. The energy is delivered from a laser.

In another aspect, the invention features an article including a substrate and a marking composition, as described herein, on the substrate.

In another aspect, the invention features a method of marking a substrate. The method includes applying to the substrate a coating as described herein and irradiating the coated substrate in a desired pattern with select radiation effective to induce a color change or contrast. In other embodiments, the coating is applied to a metal substrate, such as a beverage can. The coating is irradiated in a pattern indicating indicia.

Embodiments may have one or more of the following advantages. The coating may be colorless, clear, and/or transparent prior to irradiation. As a result, the underlying substrate, and any markings directly on the coated substrate, will be visible in areas not exposed to radiation.

The coatings may also be strongly adherent to a wide variety of substrate materials, for example, metals, such as aluminum, tin, or stainless steel, as well as glass, paper, and packaging film. For example, the composition provides good adhesion of lased coatings to the bottom of cans, as measured by a "dome inversion" test sometimes used by beverage can printers. In this test, fluid inside the can may freeze, which causes the can to expand and to push the bottom of the can outwardly. In some circumstances, in order for a coating formed on the bottom of the can to be acceptable to industry standards, the coating preferably does not fracture or flake off the bottom surface. The coating is resistant to thermal shock degradation, e.g., when cans are at room temperature and receive a beverage at about 43–47° F.

In some applications, by applying a coating composition to a substrate, e.g., a beverage can, the substrate may be marked in a production environment, e.g., one having relatively high line speed, e.g., about 1250 cans/min, and a relatively fast rate of imaging, e.g., about 250 microsecond pulse for each pixel of marking.

The coating is stable until imaged, i.e., there is a relatively long shelf life without substantial contrast development or discoloration until a laser addresses the coating. The coating is also stable at relatively high temperatures, e.g., 200° C. minimum without substantial discoloration or visual degradation, e.g., a color shift. The coating can be delivered from an environmentally friendly solvent, followed by evaporation of the solvent. The coating can be delivered as a 100% reactive fluid. By adjusting the rheological properties of the coating fluid, various application methods can be used. Such methods include, for example, spraying, lithographic pressing, and reciprocal pad printing. The applied coating can be cured by thermal treatment, e.g., at 200° C. in less than 2 minutes or less than 1 minute.

All composition percentages given are weight percent. Other features and advantages of the invention will be apparent from the description and drawings, and from the claims.

Referring to Reactions 2 and 3, through a condensation reaction catalyzed by the metal octanoate, the α,ω-siloxanediol (I) polymerizes via linear chain extension.

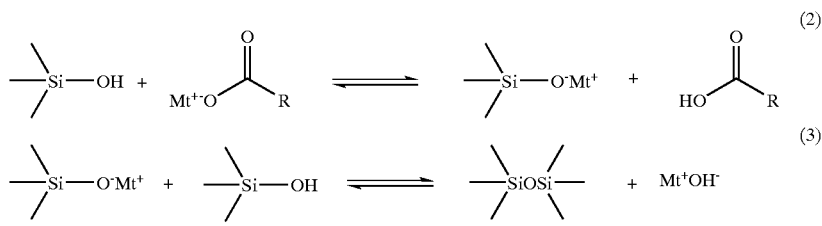

Figure 1:
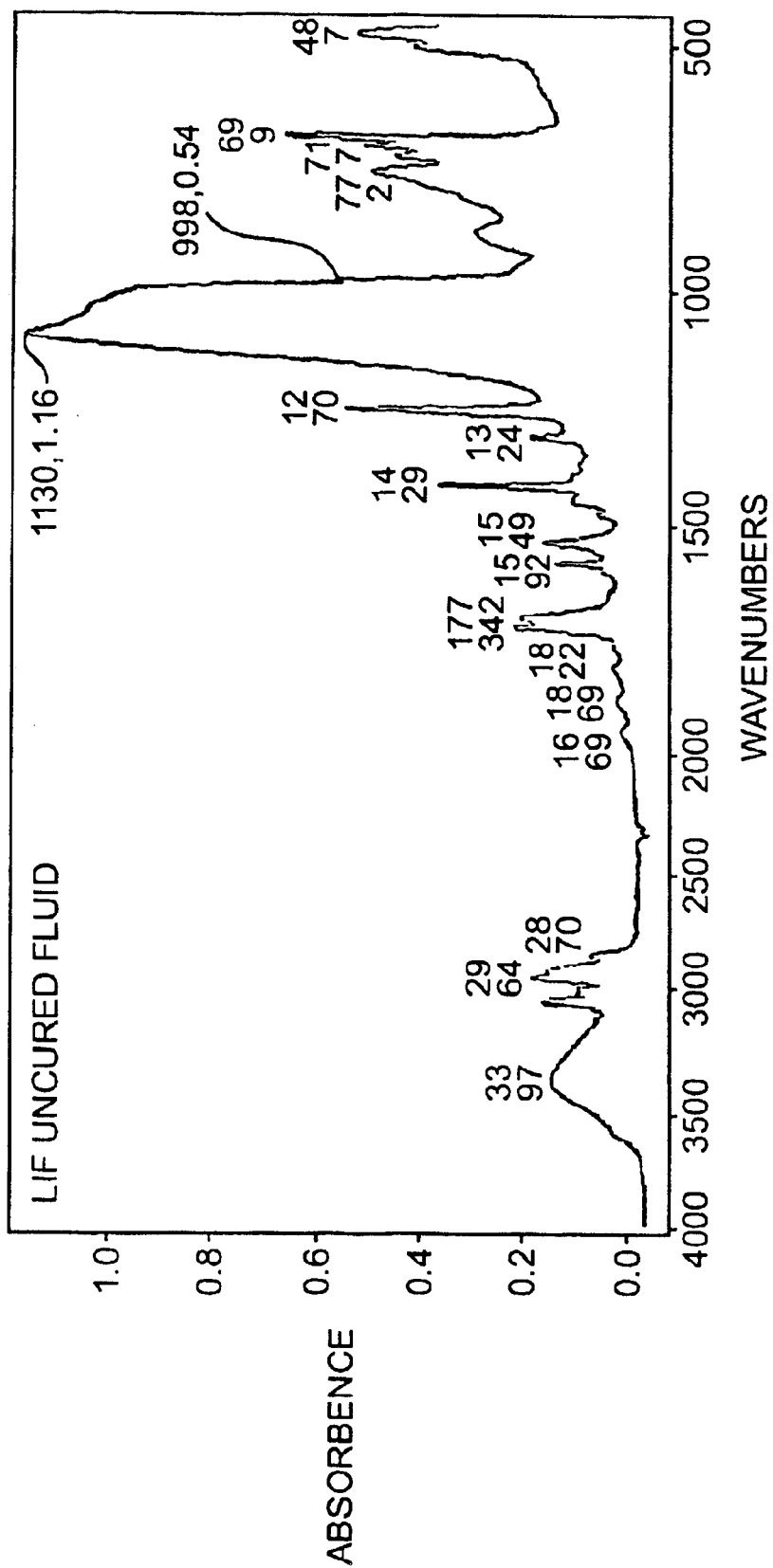
FIG. 1 is a Fourier transform infrared (FTIR) spectrum of an embodiment of an uncured coating composition.

Other mechanisms are possible.

The γ-aminopropyltriethoxysilane (II) crosslinking agent can undergo base-catalyzed hydrolysis to form a γ-aminopropylhydroxysilane (Reaction 4).

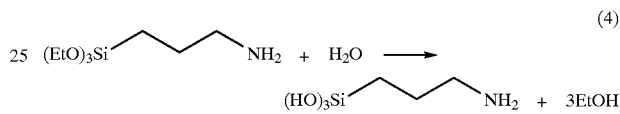

Through polycondensation, the γ-aminopropylhydroxysilane reacts with the catalyzed siloxanediol to provide crosslinking (Reaction 5) of the linear chains. For example,

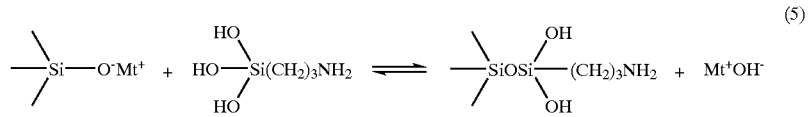

DETAILED DESCRIPTION OF THE PREFERRED EMBODIMENTS

Prior to marking a substrate, such as an aluminum can, with a laser, the substrate is treated with a laser marking coating, such as a polymeric coating.

The coating fluid generally includes a solvent having dissolved therein a resin, a crosslinking agent, and a catalyst. Reaction 1 shows an illustrative composition having an α,ω-siloxanediol (I) as the resin, a γ-aminopropyltriethoxysilane (II) as the crosslinking agent, and a metal octanoate (III) as the catalyst.

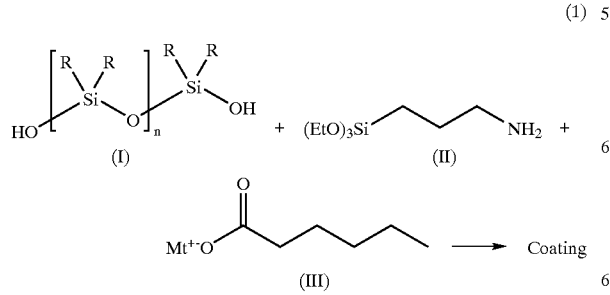

The amine can also act as a catalyst for further polycondensation reactions, for example,

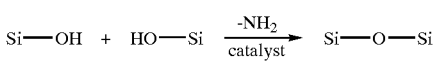

The combined condensation reactions 3 and 5 provide a crosslinked polymer having a network structure and suitable for substrate marking.

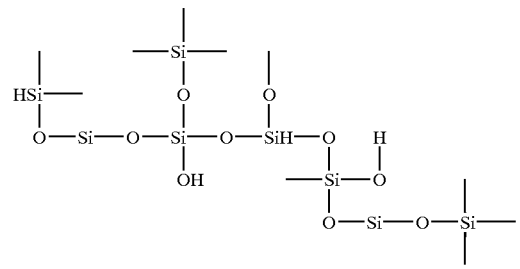

In a preferred embodiment, the above coating fluid composition further includes additives that enhance the properties, e.g., physical and/or mechanical, of the cured, polymerized coating such as flexibility and resistance to delamination and cracking. A preferred additive is a polyol, e.g., 1,4 butanediol (V), that can crosslink with the resin during the polycondensation reaction, thereby enhancing the flexibility of the polymer coating (VI).

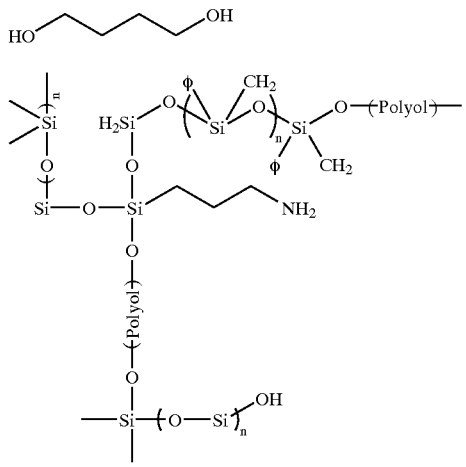

A more detailed description of polysiloxane chemistry can be found, for example, in John C. Bevington and Sir Geoffrey Allen, "Comprehensive Polymer Science: The Synthesis, Characterization, Reactions and Applications of Polymers," Oxford, N.Y., Pergamon Press 1989 ($1^{st}$ ed.); "Silicon, Germanium, & Tin Compounds Metal Alkoxides Diketonates and Carboxylates: A Survey of Properties and Chemistry" Gelest, Inc., Tullytown, Pa. 1998 ($2^{nd}$ ed.); and references cited therein, all hereby incorporated by reference in their entirety.

The coating fluid may be applied from solvent or as a 100 percent reactive solution. The coating is typically about 4–13 microns thick wet and can be applied by several methods including, industrial spraying techniques, lithography, and reciprocal pad printing. Typically, the coating fluid is then dried, e.g., by removing solvent, and cured, e.g., by heating. The substrate may be cleaned prior to application of the coating fluid by, for example, a solvent treatment or hydrogen flame treatment.

Irradiating the dried coating with a laser produces a black marking or image on the coating. Accordingly, the coating is preferably sufficiently absorbent at a select wavelength such that the coating can be heated to a desired temperature that can induce a color change (Example 1).

Without wishing to be bound to theory, it is believed that the black mark formed is "black glass", a form of $SiO_2$. Black glass can form when pyrolysis of a polysiloxane takes place in an oxygen-containing environment such as air, forming $SiO_2$. If enough carbon is present on the polysiloxane chain (in the form of hydrocarbons), free carbon can get trapped into the matrix to form $SiO_xC_y$, which is black (Example 2). More information on the pyrolysis of polysiloxanes can be found in the paper Soraru, G. D. "Polysiloxanes as Ceramic Precursors" *J. Sol-Gel Sci. and Technol.*, 1994, 2, 843, and references cited therein, all hereby incorporated by reference in their entirety.

The preferred materials for the coating fluid will now be described in more detail.

Solvent: Generally, the solvent can be any material that can dissolve the resin and other materials in the coating fluid (described below), preferably providing a clear and colorless solution. The solvent is preferably non-toxic, environmentally friendly, e.g., is EPA-approved and does not produce hazardous pollutants, stable with respect to the materials in the coating, and/or cost effective for relatively large scale manufacturing. Preferred solvents include, for example, aromatic solvents such as toluene, halogenated aromatic solvents such as benzene, 1-chloro-4-[trifluoromethyl] (CAS #98-56-6, available as Oxsol 100 from Oxidental Chemical Co.), and aliphatic solvents such as one containing n-butylpropionate.

Resin: The resin is selected such that the coating can form a mark of a select color, e.g., black, when the coating is addressed with a laser. Selection of the resin can also be based on the coating application method, adhesion and environmental durability requirements, and minimizing formation of unwanted color (e.g., bleeding or feathering) in areas adjacent to the laser address site. Preferably, the resin is essentially colorless in the visible range but absorbs in the wavelengths produced by a laser, e.g., infrared. When heated and/or with the addition of an active crosslinking agent or catalyst, as described below, the resin preferably polymerizes, e.g., via a condensation mechanism, at reaction rates required for some laser marking applications, such as 200° C. in a force air oven with a dwell time of 2 minutes or greater. In some embodiments, the resin can polymerize in less than about 1 minute, e.g., about 40 seconds or less.

The resin can be any silicon-containing material with one or more pendent carbon group, e.g., a silicone resin. For example, the silicon can be disubstituted with aromatic groups and/or aliphatic groups, or the silicon can be monosubstituted with the other group being hydrogen. Generally, the pendent group(s) can be all aromatic, all aliphatic, or a mixture of aromatic and aliphatic groups. A preferred resin is a combined aromatic and aliphatic substituted silicone resin that can absorb light energy at wavelengths produced by a laser, e.g., a carbon dioxide laser. Preferably, the resin is a hydroxyl terminated silicone resin that can undergo condensation as described above. The resin is preferably substituted with pendent groups covalently bound to the silicon atoms along the backbone.

Generally, since the black mark formed by the laser is presumably free carbon in an $SiO_2$ matrix, the resin includes a material, such as a polysiloxane, having relatively high carbon content. For example, a color change can be observed in crosslinked polysiloxanes that contain only methyl groups, but the markings created from these polysiloxanes have relatively low optical density, e.g., not sufficient for marking. Markings produced from a phenyl methyl substituted polysiloxane, however, can have relative high optical density, e.g., blacker in color. Thus, the amount of carbon present in the resin tends to determine how black a mark is (Example 3). Preferably, the pendent groups include substituents having high carbon content, such as phenyl, octyl, and propyl groups.

For phenyl methyl silicone resins, the ratio of phenyl to methyl (Ø:Me) groups is typically between about 0.4:1 and 2.1:1. As the ratio of phenyl to methyl increases, the thickness of a coating that provides good opacity, and therefore a readable image, generally decreases. For example, a resin having a 0.4:1 phenyl:methyl ratio can provide a good image with a 12 micron thick wet film (about 5 micron thick dry), while a resin having a 1.3:1 phenyl:methyl ratio can provide a good image with a ~6 micron thick wet film (about 2.5 micron thick dry).

Examples of resins include resins with silanol functionality such as phenyl, propyl silicone (propyl substituted) resin (68037-90-1, 2.3:1 Ø:Me, 6.4 wt. % hydroxyl); diphenyl, methyl, phenyl, phenylmethyl silicone resin (68037-81-0, 1.3:1 Ø:Me, 6 wt. % hydroxyl); dimethyl, methyl, phenyl silicone resin (25766-16-9, 0.6:1 Ø:Me, 6 wt. % hydroxyl); dimethyl, diphenyl, methyl, phenyl silicone resin (28630-33-3, 2:1 Ø:Me, 6 wt. % hydroxyl); dimethyl, diphenyl, methyl, phenyl silicone resin (28630-33-3, 0.7:1 Ø:Me); dimethyl, methyl, phenyl silicone resin (25766-16-9, 0.4:1 Ø:Me); and resins with methoxy functionality such as a water borne intermediate/liquid phenyl, phenylmethyl, methoxy functional resin (QP8-5314, 3:1 Ø:Me), all available from Dow Corning.

Other resins include dimethyl polymers with phenyl silsesquioxanes (73138-88-2); and dimethyl diphenyl polymers with methyl phenyl silsesquioxanes, hydroxy terminated (28630-33-3) (e.g., with 50%, 60%, 80%, or 86% solids), both available from General Electric. Still other resins are available from Wacker Chemie under the trademarks Silres REN 100 (silsesquioxanes, phenyl propyl (68037-90-1); and Silres 602 (silsesquioxanes, phenyl, propyl silicone resin, 68037-90-1, 2.3:1 Ø:Me).

Still other silicones that may be used are described in B. J. Kollmeier, Th. Goldschmidt A G, "Organo-modified silicones: Their properties and applications" *Specialty Chemicals*, Mar. 26–31, 1986, hereby incorporated by reference in its entirety.

In some embodiments, the resin can be a water-borne resin, and the solvent can be water.

The coating fluid typically includes about 10 to about 90 percent, preferably about 40 to about 60 percent, and more preferably, about 45 to about 55 percent, of the resin.

Crosslinking agent: In some embodiments, the crosslinking agent can act as a crosslinking agent and as a catalyst, e.g., by an amine functionality (Example 5). The crosslinking agent can increase the reaction kinetics of resin polymerization, thereby reducing the time required to reach a minimum degree of polymerization required for producing a resilient, markable coating, e.g., a coating that does not easily rubs off (Example 6).

Generally, the crosslinking agent includes any monofunctional or multi-functional material that will undergo condensation-type reactions with the hydroxyl groups on the silicone resin resulting in covalent bridging of the silicone resin through the crosslinking agent. Some preferred crosslinking agents include, for example, hydroxy-terminated silicone resins, alkoxy functional silanes, such as a gamma-aminopropyltriethoxysilane (available under the tradename Silquest A-1100 from OSI Specialties (Danbury, Conn.), although there was little observable difference in print durability with changes in ethoxy functionality (see Example 4). In addition, the preferred silane contains functionality that can catalyze hydrolysis reactions, such as an amino functionality on the preferred silane. In some circumstances, a significant increase in the rate of polymerization was observed with amine functional silanes compared to, for example, glycidyl ether modified silanes. In some circumstances, an epoxy terminated silane can stay fluid for about 7 days.

Other examples of crosslinking agents include Triethoxysilyl Modified Poly-1,2-Butadiene, 50% in Toluene (72905-90-9); N-(Triethoxysilylpropyl)-O-Polyethylene Oxide Urethane (37251-86-8); 3-(Triethoxysilylpropyl)-p-Nitrobenzamide (60871-86-5); N-(3-Triethoxysilylpropyl) 4,5-Dihydroimidazole (58068-97-6); N-(Triethoxysilylpropyl)Dansylamide (70880-05-6); N-[3-(Triethoxysilyl)Propyl-2-Carbomethoxyaziridine (193417-26-4); 3-Thiocyanotopropyltriethoxysilane (34708-08-2); N-(3-Methacryloxy-2-Hydroxypropyl)-3-Aminopropyltriethoxysilane; 3-Mercaptopropyltriethoxysilane (14814-09-6); 3-Isocyanotopropyltriethoxysilane (24801-88-5); 3-(2,4-Dinitrophenylamino)Propyltriethoxysilane (71783-41-0); 3-Cyanopropyltriethoxysilane (1067-47-6); Bis (Pentanedionato)Titanium-O,O'-Bis(Oxyethyl) Aminopropyltriethoxysilane; Bis(2-Hydroxyethyl)-3-Aminopropyltriethoxysilane (7583-44-5); 3-Aminopropyltriethoxysilane (919-30-2); 4-Aminobutyltriethoxysilane (3069-30-5); and N-(3-Acryloxy-2-Hydroxypropyl)-3-Aminopropyltriethoxysilane (123198-57-2).

While the silane described above can effectively crosslink the resin, under some circumstances, the coating fluid can have limited stability, e.g., for about 3–4 hours, before the coating fluid becomes undesirably viscous and difficult to process, e.g. to spread. In some embodiments, the silane is a blocked silane that can lose its blocking group(s) at elevated temperatures to act as an in situ crosslinking agent (Example 7). The blocked silane can delay extensive crosslinking of the coating fluid until initiated, e.g., by heat, which can provide easier handling and/or processing of the coating fluid, allow the coating fluid to be sprayed onto a substrate, and increase stability of the coating fluid.

Examples of blocked silanes include (3-triethoxysilylpropyl)-t-butylcarbamate; Bis[3-(Triethoxyslyl)Propyl]Urea; O-(Vinyloxyethyl)-N-(Triethoxysilylpropyl)Urethane; N-Triethoxysilylpropylquinineurethan; (S)-N-Triethoxysilylpropyl-O-Menthocarbamate (68479-61-8); N-(3-Triethoxysilylpropyl)-4-Hydroxybutyramide (186543-03-3); N-(3-Triethoxysilylpropyl)Gluconamide (104275-58-3); Triethoxysilylpropylethylcarbamate (17945-05-0); O-(Propargyloxy)-N-(Triethoxysilylpropyl)Urethane; (S)-N-1-Phenylethyl-N'-Triethoxysilylpropylurea (68959-21-7); (R)-N-1-Phenylethyl-N'-Triethoxysilylpropylurea (68959-21-7); O-(Methacryloxyethyl)-N-(Triethoxysilylpropyl)Urethane; and (S)-N-Triethoxysilylpropyl-O-Menthocarbamate (68479-61-8).

The coating fluid typically includes about 0.1 to 9 percent, preferably about 1 to about 6 percent, and more preferably, about 2 to about 4 percent, e.g., about 2.9 percent, of the crosslinking agent.

The chemistry of silanes, including, for example, their packaging and mixing sequences, are described in Sin Siew Weng et al., *Silane Coupling Agents*, (November 2000), available from http://www.sinrubtech.com/short%20notes/Short%20Notes%205.1.htm, cited with this application and hereby incorporated by reference. For example, the storage stability of many silanes can be relatively poor such that once an air-tight seal is broken, the silane is preferably used as soon as possible; silanes are preferably mixed first with certain materials before mixing with other materials, such as mixing silanes with silica before adding competing chemicals like glycols, amines, zinc oxide and some anti-degradants; and liquid silanes can be prone to hydrolysis so the silanes can be provided in, for example, heat-sealed silane +N330 in ethylene vinyl acetate bags, wax bound silane in pellet form, and thermoplastic resin bound silanes in pellet form.

Additive: An additive to the coating fluid composition can be any material that enhances the properties, e.g., physical and/or mechanical, of the coating. Preferably, the additive is a material that increases chain extension and/or that can cross link with the resin. For example, the additive can provide a cured or polymerized coating with improved resistance to tearing, cracking, e.g., upon curing, and/or delamination from a substrate. Preferably, the additive has a stability and solubility in the solvent comparable to other materials (e.g., the resin) in the coating. Preferably, the additive does not discolor or cloud the coating composition.

A preferred additive is a polyol, e.g., a diol and/or a triol. A polyol can crosslink with the resin and/or the crosslinking agent, thereby increasing the flexibility of the cured resin. A cured resin that is flexible can resist mechanical deformation, such as delamination and cracking, when the resin is applied to a substrate, e.g., a curved or dome surface of a beverage can (Examples 8 and 9). The polyol may also help increase the opacity of the lased image by increasing carbon content within the cured coating. Generally, the polyol can enhance the properties of the coating compared to a substantially identical coating without the polyol (Example 10).

Examples of polyols include materials having long carbon chains with hydroxyl termination and/or hydroxyl groups along the backbone, such as 1,2,6-hexanetriol (CAS #106-69-4); materials with long linear or non-linear, e.g., cyclic, carbon backbones with hydroxyl termination (e.g., diols) such as 1,6 hexanediol (CAS #629-11-8) and 1,10-decanediol (CAS #112-47-0); and triols such as Tone 0305 (Union Carbide) (which is <4.8% soluble in Oxsol 100, if at all, and hazy even at 4.8%.; Tone 0301 (CAS #37625-56-2, Union Carbide) (which is <4.8% soluble in Oxsol 100, if at all, and hazy even at 4.8%), and glycerol (CAS #56-81-5, Aldrich) (which is <1.0% soluble in Oxsol 100, if at all). Preferably, the polyol includes 1,4 pentanediol (CAS #626-95-9, Aldrich) (which is ≧6.9% soluble in Oxsol 100), 1,4 butanediol (CAS #110-63-4, Aldrich) (which is about 4.8% soluble in Oxsol 100 but not soluble at 6.9%). More preferably, the polyol includes caprolactone polyol materials from Union Carbide referred to as the Tone series of polyols, such as, for example, Tone 1270 (CAS #31831-53-5) (which is about 42.8% soluble in Oxsol 100) (which is solid after cooling and needs heating to be soluble), and Tone 0201 (CAS #36890-68-3) (which is 42.8% soluble in Oxsol 100, with no separation seen after a number of days).

The coating fluid typically includes about 1 to about 10 percent, preferably about 3 to about 7 percent, and more preferably, about 5 to about 6 percent, e.g., about 5.5 percent, of the additive.

Catalyst: A catalyst may be added to the coating fluid to increase the rate of polymerization. Increases in polymerization kinetics can be accomplished by adding, for example, platinum-based catalysts, zinc-based catalyst, and Lewis acids. These catalysts include, for example, acids, bases, and salts of metals, such as, for example, chromium, lead, tin, platinum complexes such as a platinum cyclovinyl siloxane complex (available as in 2–3% platinum concentration in cyclic vinylmethylsiloxanes as PC085 from UCT), and zinc, e.g., zinc octanoate. A preferred catalyst is zinc octanoate (16% Zn), which can increase the polymer molecular weight and decrease cyclic content (CAS #136-53-8; 111-90-9; 8052-41-3, available from Shepherd Chemical, Cincinnati, Ohio).

The coating fluid typically includes about 0.5 to about 5 percent, preferably, about 1 to about 4 percent, and more preferably, about 2 to about 3 percent, of the catalyst.

For coating fluid with the platinum cyclovinyl siloxane complex as a catalyst, the coating fluid typically includes about 0.01 percent to about 1.0 percent, preferably, about 0.1 percent to about 0.5 percent, and more preferably, about 0.2 percent to about 0.4 percent, of the catalyst.

Laser irradiation of the coating may be performed using 20 Watt carbon dioxide laser at 10.6 microns with a 300 microsecond pulse width. (Examples 11 and 12) Other laser conditions are possible.

In other embodiments, the resin can include organo-hydro silane polymers and copolymer, e.g., those that contain a hydro functionality, such as the methyl hydro, phenylmethyl dimethyl siloxy terminated siloxane copolymer (V) shown below (available as PS129.5 from United Chemical Technologies (UCT), Bristol, Pa.).

VII

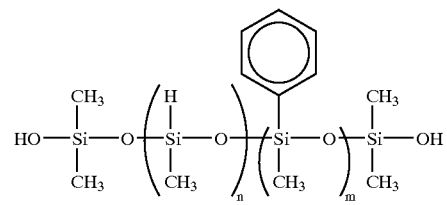

Some reactions associated with this type of resin are shown in Reactions 6 and 7 below:

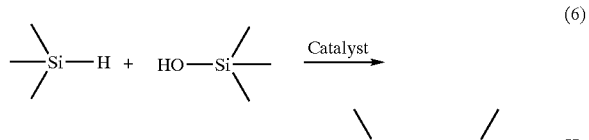

(6)

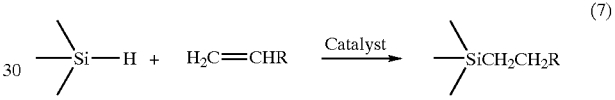

(7)

In reaction 6, the organo-hydrosiloxane can condense with itself or with any hydroxyl containing species. In reaction 7, where $CH_2=CHR$ can be a silicone resin containing a vinyl group, the Si—H bond is added across the olefin. The catalyst can be, for example, tin salts, zinc salts, and platinum complexes, as described above.

In other embodiments, heat may be provided by radiation with non-laser sources or by application of heat directly to the coating, e.g., with a resistive thermal element positioned closely adjacent to the coating.

The coating fluid can further include an optical brightener or tag that can be detected by a photodetector, which can confirm that the coating has been applied to a substrate. Preferably, the brightener is soluble in the solvent. Preferably, the brightener has a high extinction coefficient so that it can be easily detected and less material can be used. The coating with a brightener is preferably compatible for overprinting with an ink jet coder and/or with ink jet print, in addition to being laser addressable. An example includes 2,2'-(2,5-thiophenediyl)bis[5-tert-butylbenzoxazole (CAS # 7128-64-5, available as Uvitex OB from Ciba Geigy, Hawthorne, N.Y.)

The coating may also include a pigment so that, rather than a clear and colorless coating, the coating has a desired background color to enhance contrast of the image. The pigment is preferably an inert material. For example, for a white coating, titanium dioxide may be added. Other suitable pigments include barium sulfate, and Rhoplex beads, (e.g., Rhoplex ac 1024, available from Rohm and Haas, Philadelphia, Pa.).

In other embodiments, the coating can be applied to the substrate premixed or as two separate solutions, e.g., by a spray gun. The coating can be formed as a free standing film by casting it onto a piece of Teflon®, curing at 200° C., and addressing the film with a laser.

In some embodiments, the coating fluid contains no cross-linking agent, such as a silane, for example, if polymerization kinetics can be relatively slow, e.g., greater than about two minutes.

The following examples are illustrative and not intended to be limiting.

For the following examples, Sample I refers to a solution containing 5.079 grams (50.79%) Oxsol 100 (CAS #98-56-6), 4.169 grams (41.69%) diphenyl, methyl, phenyl, phenylmethyl silicone resin (Dow Corning Binder Resin 4-3136, CAS # 68037-81-0), 0.500 gram (5%) Union Carbide Tone Polyol 0201 (CAS # 36890-68-3), 0.250 gram (2.50%) Shepherd Chemical zinc octanoate (16% Zn) (CAS #s136-53-8, 111-90-0, 8052-41-3), 0.002 gram (0.02%) 2,2'-(2,5-thiophenediyl)bis[5-tert-butylbenzoxazole (Uvitex OB, CAS# 7128-64-5).

Sample II refers to a solution containing 75 grams Dow Corning Binder Resin 4-3136 (45.86%), 75 grams Oxsol 100 (45.86%), 9 grams Tone Polyol 0201 (5.5%), 4.5 grams zinc octanoate, 16% Zn (2.75%), and 0.035 gram Uvitex OB (0.02%).

Sample III refers to a solution containing 50% Dow Corning 4-3136 Binder resin and 50% Oxsol 100.

EXAMPLE 1

When lasing a coating, heat is created near the laser beam, sometimes raising the temperature to >600° C. To determine whether the heat created by the laser and/or another effect of the laser is creating the black marking, the following experiments were performed.

Sample II was coated on an aluminum plate with a 0.5 mil drawdown bar and cured at 200° C. for 10 minutes. The plate was then heated with a propane torch. At the softening point of the aluminum, the coating turned a gray/black color. This result, however, may be inconclusive because the aluminum plate melted.

The same composition as above was coated and cured on a ceramic tile. The coating was heated directly with a propane torch. As the coating was heated, it turned a brown color in the entire area of the flame. With further heating, the coating appeared to glow red-hot in isolated areas. The longer the flame was left in one place the more of the coating started to glow. When the flame was removed, the areas that were glowing had turned black. It appears that heat alone can create a color change, which is consistent with pyrolysis.

Thermogravimetric analysis (TGA) experiments were performed on cured Sample II in air under isothermal conditions at 400° C., 500° C., and 700° C. At 400° C., an amber color was observed; at 500° C., a brown color was observed; and at 700° C., a dark brown color was observed. Cured Sample II was also pyrolyzed under a nitrogen atmosphere at 1000° C. The sample turned into a shiny black glass. FTIR analysis indicates that the glass is the same material that is formed with the propane torch and laser.

EXAMPLE 2

Fourier transform infrared (FTIR) spectra were obtained for a dried and uncured (i.e., not crosslinked) coating (Sample II), a cured (crosslinked) coating (Sample II cured at 200° C. for 10 minutes), and a charred material obtained from heating the cured coating with a propane torch. Spectra were interpreted using "Silanes, Silicones, and Metal-Organics," a catalog available from Gelest, Inc., as a guide.

The FTIR spectrum for the uncured coating is shown in FIG. 1. Table 2A shows the peak assignment for FIG. 1:

TABLE 2A

| Functional Group | Wavenumber (cm$^{-1}$) |
|---|---|
| —Si— (phenyl) | 1429, 772 |
| —Si(CH$_3$)$_2$—O— | 1270 |
| Si—O—Si<br>Si—O—C$_2$H$_5$ | 1130<br>998, and peaks hidden under broad peak at 1130 |
| —Si(CH$_3$)(phenyl)—O— | 750–699 |

The peaks at 1959 cm$^{-1}$, 1889 cm$^{-1}$, and 1822 cm$^{-1}$ are assigned to phenyl substitution overtones. The peak at 1324 cm$^{-1}$ is assigned to the residual Oxsol 100 solvent. According to the Gelest reference, as the molecular weight of a polysiloxane increases, the broad Si—O—Si peak around 1150–1000 cm$^{-1}$ splits and/or becomes more complex. This is observed in the spectrum obtained for the crosslinked coating.

Figure 2:
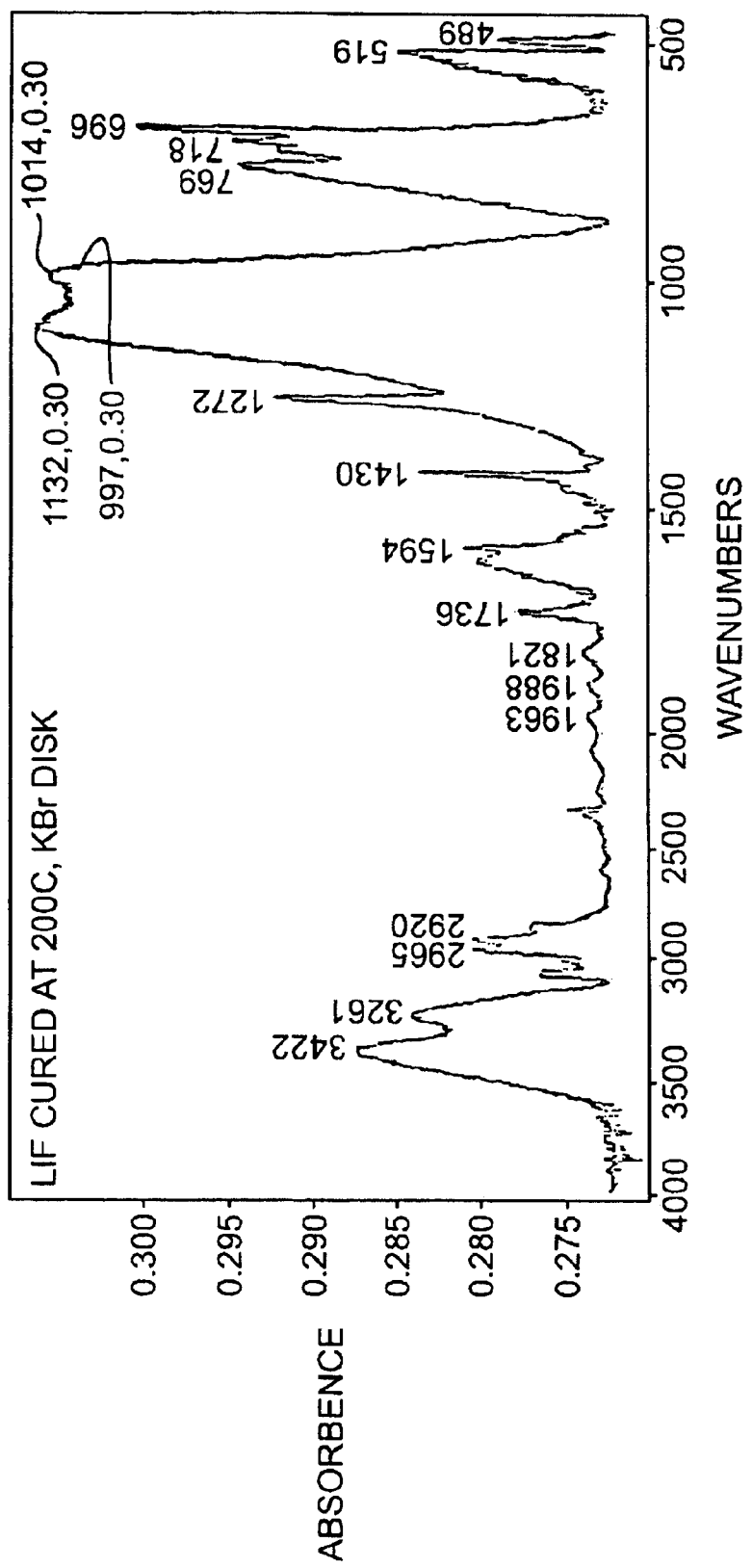
FIG. 2 is a FTIR spectrum of an embodiment of a cured coating composition.

Referring to FIG. 2, the spectrum for the cured coating contains the same peaks as in the spectrum for the uncured coating. Furthermore, and the broad Si—O—Si peak has split to include 1132 and 1014 cm$^{-1}$.

Figure 3:
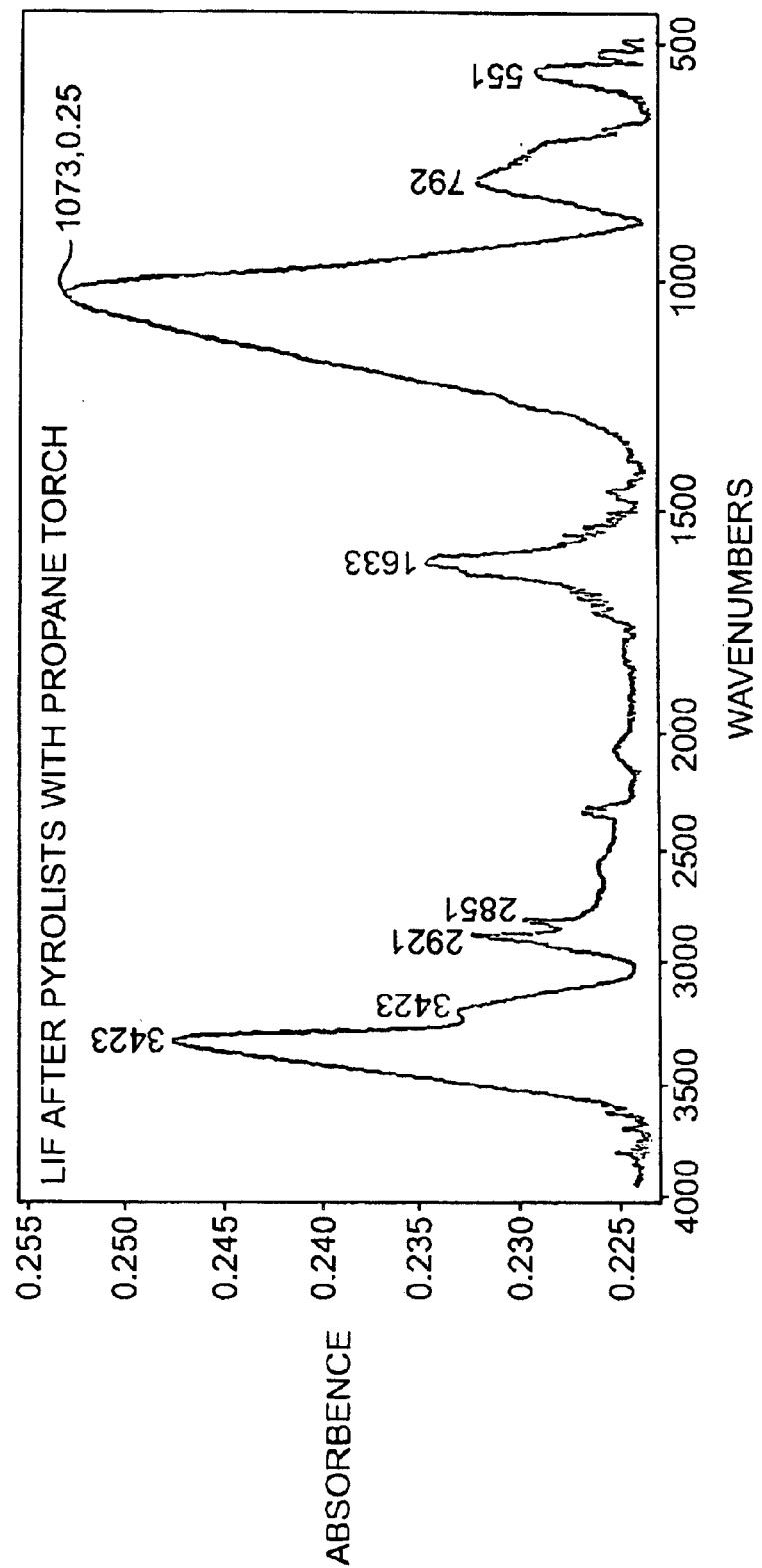
FIG. 3 is a FTIR spectrum of an embodiment of a cured coating composition that has been pyrolyzed with a propane torch.

Referring to FIG. 3, the spectrum for the charred material contains no organic peaks. The spectrum includes a strong Si—O—Si peak at 1073 cm$^{-1}$. The broad peak at 792 cm$^{-1}$ can be assigned to Si—C (silicon carbide) or amorphous silica, both of which show characteristic absorption at about 800 cm$^{-1}$. The peak at about 1633 cm$^{-1}$ may be due to a carbonyl attached to Si in the β-position, example structure below:

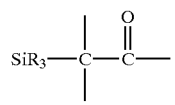

Figure 4:
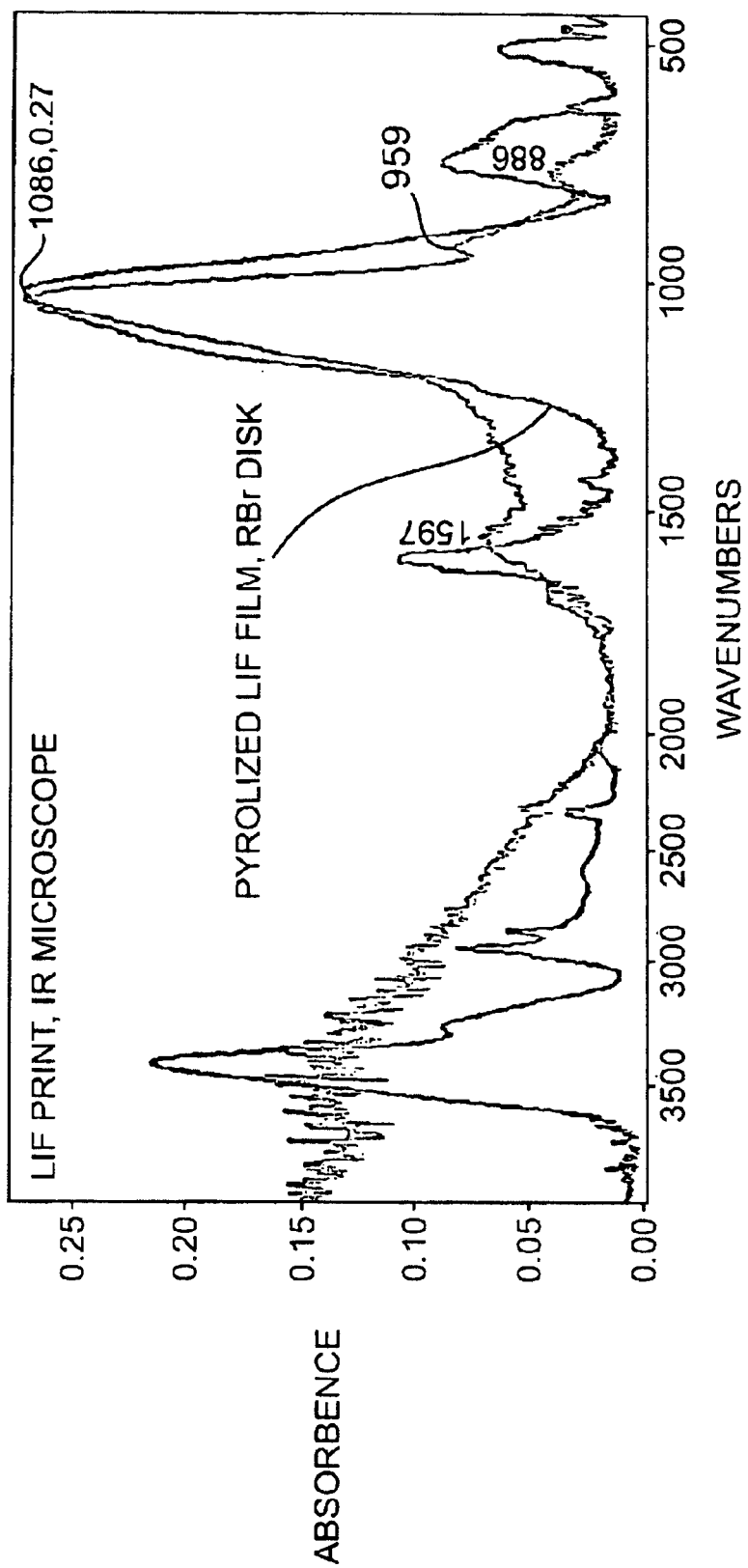
FIG. 4 are FTIR spectra of an embodiment of a cured coating that has been pyrolyzed and an embodiment of a cured coating that has been addressed with a laser.

A FTIR spectrum of a black dust formed by lasing an uncured coating was compared to the FTIR spectrum of the black charred material above (FIG. 4). The Si—O—Si peak is shifted to 1070 cm$^{-1}$, and the peak assigned to silicon carbide or amorphous silica is shifted to 806 cm$^{-1}$. According to the Gelest reference, these shifts are acceptable, and the exact peak location is dependent on the environment of the functional group.

EXAMPLE 3

To determine the effect of changing substituent groups on a silicon atom on a lased image, a dimethyl, methyl hydro siloxane copolymer was tested. The copolymer (PS122.5, available from UCT) contains no phenyl groups and can be crosslinked through a self-condensation reaction catalyzed by a platinum complex (e.g., PC085, also available from UCT).

Ten grams of PS122.5 was mixed with 0.03 g of PC085 in a scintillation vial, and the mixture was shaken well. Using a 0.5 mil drawdown bar, thin films were formed on aluminum substrates. The films were crosslinked at 200° C. for 10 minutes. The cross linked films were passed under a laser (Domino DDC-2) at pulse widths from 50 $\mu$s to 800 $\mu$s in 50 $\mu$s intervals.

At 50 $\mu$s, no color change was observed. At 100–400 $\mu$s, a faint black color was observed. Starting at 450 $\mu$s, a more noticeable color change was observed, and the amount color observed increased up to 600 $\mu$s. At pulse widths above 600 $\mu$s, no increase in color was observed. Because the copolymer was able to form an observable marking, it appears that color formation can be achieved without phenyl groups in the resin.

Additional samples were prepared with a methyl hydro, phenylmethyl copolymer with ~50% phenylmethyl content (PS129.5); a methyl hydro, octylmethyl siloxane copolymer with ~50% octylmethyl content (PS125); and a methyl hydro, octylmethyl siloxane copolymer with ~70% octylmethyl content (PS125.5). Each sample was cured at 200° C. for 10 min and imaged with the laser at a 300 $\mu$s pulse width.

The markings are darker as more carbon is added to the Si—O backbone. PS129.5 produces dots that are larger in size than the others, which gives the appearance of a darker print overall, but PS125 and PS25.5 produce markings that were blacker. This data, which suggest that increasing carbon content in the resin tends to increase color formation, supports the black glass hypothesis.

TGA isothermal runs at 700° C. were performed on cured samples of PS122.5, PS125.5, and PS129.5. PS122.5 (dimethyl substituted) turned a deep amber color. PS125.5 (methyl octyl substituted) and PS129.5 (methyl phenyl substituted) turned black. Also, PS122.5 showed much lower weight loss compared to PS129.5. The data: is consistent with the black glass theory. Lower carbon content shows lower weight loss, and as carbon content increases, the color change is more noticeable because, it is believed, there is more free carbon available to be trapped in an $SiO_2$ matrix.

EXAMPLE 4

To determine the effect of crosslinking density on the durability of coatings and lased images, silanes with varying degrees of ethoxy functionality were tested. The following samples were prepared:

TABLE 4A

|  | A | B | C | D |
|---|---|---|---|---|
| Sample I | 10.0 | 10.0 | 10.0 | 10.0 |
| 3-aminopropyltriethoxysilane (Witco Silquest A-1100) | 0.3 | | | |
| 3-aminopropyldimethylethoxysilane (UCT A0735, CAS# 18306-79-1) | | 0.3 | | |
| 3-aminopropylmethyldiethoxysilane (UCT 0742, CAS# 3179-76-8) | | | 0.3 | |

The above samples were prepared by weighing the materials into scintillation vials and shaking the vials by hand to provide mixing. The samples were then poured into aluminum pans and allowed to air dry to remove some of the solvent. Samples were then placed into an oven at ~200 C. for 10 minutes.

To evaluate the susceptibilities of the cured materials to being re-dissolved by a solvent, the above samples were placed into Oxsol 100 and pentane and observed for dissolution. For the samples in Oxsol 100, no visible dissolution was observed, i.e., no Schlerier lines were observed. The films were submerged overnight in Oxsol 100, and there was no change. For the samples in pentane, the samples were mixed using a stir bar inside the scintillation vial for ½ hour. No visible change was observed. Thus, neither Oxsol 100 nor pentane dissolves the tested cured coatings. In Sample D (the control), the large chunk broke up into smaller particles in both Oxsol 100 and in pentane.

To test coating durability, drawdowns of clear samples were made with a bar onto pre-cleaned aluminum coupons (6061-T6) (1"W×3"L×0.032"T). Coupons were placed into a ~200 C. oven for 2, 5, and 10 minutes. Coupons were then cooled to room temperature and given 10 double rubs with an Oxsol 100 soaked applicator (Puritan 6 inch Cotton Tipped Applicators) ("Oxsol wipe test"). This test is used to evaluate crosslinking of monomers, for example, a highly crosslinked monomer typically shows no dissolution when immersed in the solvent in which the monomer was dissolved. Films were evaluated for the amount of film deterioration observed. None of the films at any of the times showed deterioration. In Sample D (control), the film was completely removed down to the aluminum substrate for 2 and 5 minutes; and at 10 minutes, there was visual degradation but not complete removal as at 2 and 5 minutes. From this qualitative test, the amount of ethoxy functionality has a minimal effect on coating dissolution, but is desirable to prevent complete removal of the film.

Print durability was evaluated using a Crock test.

Aluminum coupons were coated with the above samples. Images were created using a Domino DDC-2 laser using $CO_2$ wavelength tubes (10.6 $\mu$) at a pulse width of 300 $\mu$sec. A typical image was: 12345ABC. After imaging, the coupons were placed onto a crockmeter (A.A.T.C.C. Crockmeter, Model CM 1, available from Atlas Electric Devices Co.) using double backed tape. A white cotton test cloth (A.A.T.C.C. Test Fabrics, Crockmeter Squares) was held in place by a clamp.

A "finger" having the cloth attached thereto was carefully placed onto the coupon to provide a stroke length that covers the entire image area. The image was crocked for 2×10 strokes and evaluated for legibility and wear.

The durability of the samples was very similar, if not the same. Results were similar for all cure times. The main observable difference is that the crosslinking agent with three ethoxy functionalities produces better definition of the lased dot. Generally, however, qualitative testing suggests that there is little difference in print durability with changes in ethoxy functionality. In Sample D (control), generally more material was removed with decreasing cure time (i.e., 2 min>5 min>10 min). The print, however, was legible at all tested times.

EXAMPLE 5

The effect of a primary amine, 2-ethylhexylamine (98% Aldrich), on print durability, was evaluated. Four samples were made: each had 10.0 grams of Sample I and varying amounts of the amine (0.3, 0.5, 0.7, 1.0 gram).

Solutions were drawn down onto aluminum and cured at ~200° C. for 2 and 5 minutes. Films were then tested for crosslinking by the Oxsol wipe test described in Example 4.

TABLE 5A

| | Time in Oven | |
|---|---|---|
| Sample | 2 minutes | 5 minutes |
| 0.3 g amine | Material is almost completely removed. | No material is removed |
| 0.5 g amine | Material is almost completely removed, slightly better than A | No material is removed |
| 0.7 g amine | No material is removed | No material is removed |
| 1.0 g amine | Very slight removal of material | No material is removed |

From Table 5A, it appears that the primary amine is not as resistant to dissolution as the amino functional silanes, as evaluated by the Oxsol wipe test.

However, the above samples were also evaluated for rub resistance by using the Crock meter test described in Example 4. Here, in terms of assessing how dark the prints remain, the amine appears to be qualitatively comparable with the silanes.

EXAMPLE 6

To determine any effect on print quality and durability of a coating having a 1°, 2°, or 3° amine, the following samples were prepared:

TABLE 6A

| | A | B | C |
|---|---|---|---|
| Sample 1 | 10.0 | 10.0 | 10.0 |
| 2-ethylhexylamine (1° amine) | 0.30 | | |
| Dioctylamine (2° amine) | | 0.30 | |
| Trioctylamine (3° amine) | | | 0.30 |

The above samples were weighed into a scintillation vial and hand shaken to provide mixing. ½ mil wet drawdowns were made onto aluminum coupons. The coated coupons were placed into an oven at ~200 C. for the following times: 2, 5, and 10 minutes. Coatings were then imaged using the Domino DDC-2 laser at ~3 meters/minute and a pulse width of 300 μs.

Microphotographs reveal poor print quality for all amines cured for 2 minutes, and the 3 amine sample also shows poor print quality for the 5 minute cure time. The remaining samples were all legible.

Print durability was evaluated using the Crock meter test described in Example 4. The results are shown in Table 6B:

TABLE 6B

| Time in Oven (Mins) | A (1°) | B (2°) | C (3°) |
|---|---|---|---|
| 2 | Completely removed, 1 stroke | Completely removed, 1 stroke | Completely removed, 2 strokes |
| 5 | Completely removed, 10 strokes | Completely removed, 10 strokes | Completely removed, 3 strokes |
| 10 | Almost completely removed after 10 strokes, print somewhat legible | Almost completely removed after 10 strokes, print somewhat legible, although less than 1 | Completely removed, 10 strokes |

EXAMPLE 7

An example of a blocked silane is a silane having a secondary amine, (3-triethoxysilylpropyl)-t-butylcarbamate (available as SIT8186.5 from Gelest, "SIT"), which undergoes the following reaction:

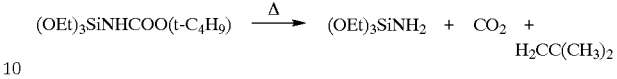

The following samples were prepared:

TABLE 7A

| Sample | A | B | C | D | E |
|---|---|---|---|---|---|
| Sample II | 10.0 | 10.0 | 10.0 | 10.0 | 10.0 |
| SIT | 0.1 | 0.3 | 0.5 | 1.0 | |
| Silquest A-1100 | | | | | 0.3 |
| Totals | 10.1 | 10.3 | 10.5 | 11.0 | 10.3 |

Samples were prepared in scintillation vials and hand shaken to provide mixing. For the initial trial, the samples were left to sit overnight and observed for changes in viscosity or gelling. Of the four samples above, samples A & B showed a cloudy appearance overnight and samples C & D were both clear. To provide a comparison between a SIT sample and a Silquest A-1100 sample, sample B was prepared with the SIT, sample E was prepared with the A-1100, and both samples were placed into a viscometer. The change in viscosity was recorded as a function of time. The results are listed below, with the A-1100 as a reference point.

TABLE 7B

| Hours:Minutes | A-1100 Sample Change in Viscosity | SIT Sample Change in Viscosity |
|---|---|---|
| 0 | 0 | 0 |
| 0:10 | 2.6 | -0.2 |
| 0:20 | 6.0 | -0.2 |
| 0:30 | 9.8 | -0.2 |
| 0:40 | 13.8 | -0.2 |
| 0:50 | 17.7 | -0.1 |
| 1:00 | 22.6 | 0.0 |
| 1:10 | 27.8 | 0.0 |
| 1:20 | 33.0 | 0.1 |
| 1:30 | 38.6 | 0.1 |
| 1:40 | 44.6 | 0.1 |
| 1:50 | 51.4 | 0.1 |
| 2:00 | 58.9 | 0.2 |

TABLE 7B-continued

| Hours:Minutes | A-1100 Sample Change in Viscosity | SIT Sample Change in Viscosity |
|---|---|---|
| 2:10 | 67.3 | 0.3 |
| 2:20 | 76.8 | 0.4 |
| 2:30 | 86.0 | 0.5 |
| 2:40 | 95.8 | 0.6 |

The starting viscosities for the above were 34.4 cPs for the A-1100 sample and 28.0 cPs for the SIT sample. The SIT (blocked silane) sample showed good stability.

Tests were then performed to determine whether the above deblocking reaction would occur to provide crosslinking. ¼ mil wet drawdowns of the A-1100 and SIT were made onto pre-cleaned aluminum coupons, which were then placed into a ~200 C. oven for 10 minutes. After the coupons cooled, the coating samples were subjected to the Oxsol wipe test described in Example 4. Under this test, neither coating showed any deterioration.

Samples B and E, with SIT and A-1100, respectively, were also subjected to the Oxsol wipe test over shorter cure times. The results are shown in Table 7C:

TABLE 7C

| Time (Min) | Silane | Results |
|---|---|---|
| 1 | A-1100 | Slight film deterioration |
| 1 | SIT | Majority of film removed |
| 2 | A-1100 | No film removed |
| 2 | SIT | Majority of the film removed, although better than at 1 minute |
| 3 | A-1100 | No film removed |
| 3 | SIT | Slight film deterioration |
| 5 | A-1100 | No film removed |
| 5 | SIT | Slight film deterioration |
| 7 | A-1100 | No film removed |
| 7 | SIT | No film removed |

Table 7C indicates that the SIT (blocked silane) does not crosslink the resin at 200 C. as quickly as the A-1100 (unblocked silane).

To identify how durable, e.g., not removable with rubbing, the image is with the SIT, coatings were made at the 3% (w/w) level (Sample B) and cured at 200 C. for 2, 5, and 10 minutes. Durability of the coating was determined by the amount of black marks seen on a cotton square designed to be used with the crock meter. All samples were subjected to 10 2× rubs. Results are shown in Table 7D.

TABLE 7D

| Time (Min) | Results |
|---|---|
| 2 | Print is still visible, although the coating is worn through to the metal in places. Heavy dark mark seen on the cloth. |
| 5 | Only very slight wearing of the coating seen. Print is clearly legible, although there is a heavy dark mark left on the cloth. |
| 10 | No wear seen on coating and the print is clearly legible. Overall, much less of a dark mark seen on the cloth. |

The data with regard to the print durability appear to be comparable to those of the A-1100. After 17 days, there was no significant change in viscosity, as compared to the unblocked siland, which typically had only three hours of viscosity stability.

EXAMPLE 8

The effect of diols on adhesion and cracking of a marking coating was evaluated using a 90 bend test. The bend test is performed using 6061 aluminum coupons (3"L×1"W× ¹⁄₃₂"T) with a coating applied and cured as described earlier. The coupon is placed into a vise and bent in one motion to approximately a 90 angle. The area of interest is the coating closest to the bend, where the stress on the coating is at the maximum.

The following samples were prepared:

TABLE 8A

| Sample | A | B | C | D (Control) |
|---|---|---|---|---|
| Sample III | 10 | 10 | 10 | 10 |
| Zn Octanoate | 0.3 | 0.3 | 0.3 | 0.3 |
| 1,4 Butanediol | 0.1 | 0.2 | 0.25 | 0 |

The samples were drawn down to thicknesses of ¼ and ½ mil and cured for different amounts of time (1, 5 and 10 minutes). Fracturing and delamination were evaluated using the 90° bend test described above, and print robustness was evaluated using the Crock test described above.

TABLE 8B

¼ Mil Wet Draw Down for 1,4 butanediol

| Sample | Fracturing/ Delamination | Time in Oven | | |
|---|---|---|---|---|
| | | 1 minute | 5 minutes | 10 minutes |
| A | Fracturing | NF | Micro | NF |
| | Delamination | Yes | Yes | Yes |
| | Print Robustness | Poor | Decent | Good |
| B | Fracturing | NF | Micro | NF |
| | Delamination | Yes | Yes | No |
| | Print Robustness | Poor | Decent | Good |
| C | Fracturing | NF | Micro | NF |
| | Delamination | Yes | Yes | No |
| | Print Robustness | Poor | Decent | Good |
| D | Fracturing | NF | Micro | NF |
| | Delamination | Yes | No | No |
| | Print Robustness | Poor | Decent | Good |

TABLE 8C

½ Mil Wet Draw Down for 1,4 butanediol

| Sample | Fracturing/ Delamination | Time in Oven | | |
|---|---|---|---|---|
| | | 1 minute | 5 minutes | 10 minutes |
| A | Fracturing | NF | Micro | NF |
| | Delamination | No | No | No |
| | Print Robustness | Poor | Decent | Good |
| B | Fracturing | NF | Mass | NF |
| | Delamination | Yes | No | No |
| | Print Robustness | Poor | Good | Good |
| C | Fracturing | NF | Micro | Micro |
| | Delamination | Yes | No | No |
| | Print Robustness | Poor | Decent | Good |
| D | Fracturing | NF | Mass | NF |
| | Delamination | Yes | Yes | No |
| | Print Robustness | Poor | Good | Good | where

TABLE 8D

| Key | |
|---|---|
| | Print Robustness |
| Poor | Print is completely removed |
| Decent | Some material is removed, print is still legible |
| Good | Although some black material is removed, print is still very legible |
| | Fracturing |
| NF | No fracturing seen |
| Micro | Micro-fracturing seen in sample |
| Mass | Massive fracturing seen |
| | Delamination |
| Yes | Material was removed when scraped with a dental tool, and then wiped with a finger. |
| No | Material was not removed by above procedure |

The following samples were then prepared with Tone 0201:

TABLE 8E

| Sample | A | B | C |
|---|---|---|---|
| Sample III | 10 | 10 | 10 |
| Zn Octanoate | 0.3 | 0.3 | 0.3 |
| Tone 0201 | 0.5 | 0.6 | 0.2 |
| Silquest A-1100 | 0.5 | 0.5 | 0.5 |

TABLE 8F

¼ mil Wet Draw Down For Tone 0201

| | | Time in Oven | | |
|---|---|---|---|---|
| Sample | Fracturing/Delamination | 1 minute | 5 minutes | 10 minutes |
| A | Fracturing | Mass | No | No |
| | Delamination | Yes | No | No |
| | Print Robustness | Slight | Good | Excellent |
| B | Fracturing | No | No | No |
| | Delamination | No | No | No |
| | Print Robustness | Fair | Good | Excellent |
| C | Fracturing | Micro | No | No |
| | Delamination | No | No | No |
| | Print Robustness | Good | Good | Excellent |

The following samples were prepared with Tone 0201 and Tone 1270:

TABLE 8G

| Sample | A | B | C | D | E | F |
|---|---|---|---|---|---|---|
| Sample III | 10 | 10 | 10 | 10 | 10 | 10 |
| Tone 0201 | 0.1 | 0.25 | 0.5 | | | |
| Zn Octanoate | 0.3 | 0.3 | 0.3 | 0.3 | 0.3 | 0.3 |
| Tone 1270 | | | | 0.1 | 0.25 | 0.5 |

TABLE 8H

¼ Mil Wet Draw Down For Tone 0201 and Tone 1270

| | | Time in Oven | | |
|---|---|---|---|---|
| Sample | Fracturing/Delamination | 1 minute | 5 minutes | 10 minutes |
| A | Fracturing | Mass | Micro | Mass |
| | Delamination | No | No | No |
| | Print Robustness | Poor | Poor | Poor |
| B | Fracturing | Mass | Micro | NF |
| | Delamination | No | No | No |
| | Print Robustness | Poor | Poor | Fair |
| C | Fracturing | Mass | Mass | NF |
| | Delamination | No | No | No |
| | Print Robustness | Poor | Poor | Decent |
| D | Fracturing | Micro | Micro | Mass |
| | Delamination | No | No | No |
| | Print Robustness | Poor | Poor | Fair |
| E | Fracturing | Mass | Mass | Mass |
| | Delamination | No | Small amount | No |
| | Print Robustness | Poor | Poor | Poor |
| F | Fracturing | Micro | Mass | Micro |
| | Delamination | No | No | No |
| | Print Robustness | Poor | Poor | Poor |

Delamination properties of samples A–F were also evaluated by a freeze/water adhesion study in which aluminum coupons with the coatings were submerged in an ice bath for the time indicated.

TABLE 8I

| Sample | 1 Minute | 5 Minutes | 10 Minutes |
|---|---|---|---|
| A | Yes | Yes | Yes |
| B | Yes | Yes | Yes |
| C | Yes | Yes | No |
| D | Yes | Yes | Yes |
| E | Yes | Yes | Yes |
| F | Yes | Yes | No | where "Yes" means that the coating was removed by a scratch, and "No" means no coating was removed by a scratch.

The coating was not removed when the highest tested concentration of polyol was used and the cure time was 10 minutes.

EXAMPLE 9

The effect of adding a silane (Silquest A-1100) to a coating composition containing Tone 0201 was evaluated by preparing the following samples:

TABLE 9A

| Sample | A | B | C |
|---|---|---|---|
| Sample III | 10 | 10 | 10 |
| Zn Octanoate | 0.3 | 0.3 | 0.3 |
| Tone 0201 | 0.5 | 0.6 | 0.2 |
| Silquest A-1100 | 0.5 | 0.5 | 0.5 |

TABLE 9B

| | ¼ Mil Wet Draw Down thickness | | |
| | | Time in Oven | |
| Sample | Fracturing/Delamination | 1 minute | 5 minutes | 10 minutes |
|---|---|---|---|---|
| A | Fracturing | Mass | No | No |
|   | Delamination | Yes | No | No |
|   | Print Robustness | Slight | Good | Excellent |
| B | Fracturing | No | No | No |
|   | Delamination | No | No | No |
|   | Print Robustness | Fair | Good | Excellent |
| C | Fracturing | Micro | No | No |
|   | Delamination | No | No | No |
|   | Print Robustness | Good | Good | Excellent |

Adding the silane enhanced the fracturing, delamination, and print robustness properties of the coating.

EXAMPLE 10

To study the effect of polyols on a marking composition, the following samples, without a polyol, were prepared:

TABLE 10A

| Sample | A | B | C | D | E |
|---|---|---|---|---|---|
| Sample III | 10 | 10 | 10 | 10 | 10 |
| 3-aminopropyltriethoxysilane (Witco Silquest A-1100) | 0.3 | | | | |
| 3-aminopropyldimethylethoxysilane (UCT A0735) | | 0.3 | | | |
| 3-aminopropylmethyldiethoxysilane (UCT A0742) | | | 0.3 | | |
| 3-triethoxysilylpropyl-t-butylcarbamate | | | | 0.3 | |
| 2-ethylhexylamine | | | | | 0.3 |

Samples were weighed into scintillation vials and mixed by shaking the vials. When the samples were clear, they were drawdown onto clean aluminum coupons with a bar. The coupons were then placed into an oven at approximately 200° C. for about 2 minutes, and cooled to room temperature. For each sample, a coupon was lased to evaluate image quality, before and after crocking. Each lased sample was also tested for resistance to removal by Oxsol 100 by subjecting the samples to ten double rubs with an applicator soaked with Oxsol 100 (Oxsol wipe test).

Microphotographs were taken of lased samples before the samples were subjected to crocking. Sample D did not show any print durability and included black amorphous clouds. The clouds may be similar to black material created by the laser that is being deposited around the area where imaging was done. Sample E showed poor durability and color development, with lased spots having white halos.

The lased samples were then crocked. Samples D and E showed the worst results. For example, in sample D, a dot created by the laser was sometimes completely removed by crocking, and sample E showed heavy abrasion. Samples A, B, and C all showed decent dot retention. Results are tabulated below:

TABLE 10B

| Sample | Image Quality before Crocking | Image Durability after crocking | Oxsol 100 wipe resistance |
|---|---|---|---|
| A | Nice Quality, good dot definition | Little material removed, very readable. | Very slight film deterioration seen. Film is still intact. |
| B | Nice Quality, good dot definition | Little material removed, very readable. | No deterioration seen. |
| C | Nice Quality, good dot definition | Little material removed, very readable. | No deterioration seen. |
| D | No image durability, black "cloud" effect around where image was made | Material completely removed, Essentially no evidence a code was there. | Film is completely removed. |

TABLE 10B-continued

| Sample | Image Quality before Crocking | Image Durability after crocking | Oxsol 100 wipe resistance |
|---|---|---|---|
| E | Image has a whitish hazy appearance. Not a sharp print. | Image is essentially completely removed. Film is also heavily abraded, the only coating to have this effect. | Film is completely removed. |

Compared to the blocked silane (D) and the amine (E) samples, the three silanes tested (A, B & C) showed better image quality, print durability, and resistance of the cured film to solvent dissolution. Since testing done was performed with a cure time of 2 minutes, the amine and the t-butylcarbamate blocked silane may need more time at this temperature to provide durable prints, if they are obtainable at all. The absence of the Tone polyol appears to have a negative effect to the primary amine and t-butylcarbamate blocked silane, in terms of print formation and durability.

EXAMPLE 11

Different lasers and wavelengths were evaluated to determine parameters that can create an image.

A fluid sample was prepared with 0.3 gram of Silquest A-1100 and 10 grams of a prepared solution (Sample I). Coatings of the fluid were made onto aluminum coupons using a ¼ wet draw down bar. Samples were cured for 5 minutes at ~200 C.

Table 11A describes the lasers used in this evaluation, along with the results produced from that laser.

TABLE 11A

| Wavelength (approximate) | Watts | Beam Diameter (Unfocused) | Spot Size (Microns) | Fluence (approx. Power Density) | Results |
|---|---|---|---|---|---|
| 532 nm (Green) doubled YAG | 10 mW | 8 mm | 3.5 | 110 kW/cm$^2$ | No image created |
| 632.8 nm (Red) Helium-Neon | 15 mW | 8 mm | 4.0 | 117 kW/cm$^2$ | No image created |
| 831 nm (IR) Laser Diode | 1 W | | 50 | 50 kW/cm$^2$ | No image created |
| 1112 nm | 15 W | | | | Image created at 7+ Watts, 100 mm/sec. scan rate |
| 10.6 μ $CO_2$ | 20 W | focused | 168 | | Image made with <0.1 mJ |

Images were created at wavelengths of 10.6μ and 1112 nm, but not at shorter wavelengths. This is believed to be due to energy being applied to the coating, or not enough absorbance of the coating at that particular wavelength to convert the energy to heat and pyrolyze the coating.

EXAMPLE 12

Different powered lasers were evaluated to study the relationship between the size of a dot imaged and the amount of power to produce the dot. For example, if a high powered laser is used, ablation may dominate over pyrolysis, but if a relatively low powered laser is used for longer dwell times, then perhaps energy from the laser may be more efficiently used to produce an image.

Aluminum coupons were placed into a 1M NaOH solution for about 5 minutes. The NaOH solution was used to change the surface of the aluminum coupons and to "whiten" the background of the aluminum coupon, making it easier to detect imaged dots using a QEA system (Quality Engineering Associates, Inc., Burlington, Mass., software version 1.6.3C). After the coupons were removed from the solution, they were wiped down using a KimWipe® tissue and then wiped using a KimWipe® tissue soaked with a 50%:50% by volume solution of ethyl acetate and isopropanol. These procedures provided a white opaque background on the coupons.

A sample of 0.3 gram of Silquest A-1100 and 10 grams of Sample I was prepared. The materials were weighed into a scintillation vial and hand shaken to provide mixing. Using a ¼ mil drawdown bar, 3 drawdowns were prepared for each of the following pulse widths (μs) to be tested: 50, 100, 200, 300, 400, 500, 600, 700, and 800. The total number of drawdowns was 27. Samples were cured at 200 C. for 5 minutes.

A multi-tube laser system was used. The system includes seven laser tubes that direct seven laser beams to a focusing lens. The lens then directs and focuses the beams onto a substrate. Referring to Table 12A, the laser (Domino DDC-2) configuration was:

TABLE 12A

| Tube # | Type of Tubes |
|---|---|
| 1 | Standard |
| 2 | Standard |
| 3 | Standard |
| 4 | Standard |
| 5 | LEEP |
| 6 | Standard |
| 7 | LEEP |

The standard tubes output nominally 20 Watts, and the LEEP tubes output nominally 25 Watts. Typically, the LEEP tubes have a quicker rise and fall time; i.e., they reach full power quicker than the standard tubes. The feedrate of the samples was ~3 meters/minute.

Measurements were taken using a QEA system (IAS 1000) on 18 dots (except for the 50 microseconds sample, in which 9, 17, and 18 dots were measured).

An average diameter (in mils) was calculated using the following formula $$2 * \frac{\sqrt{(AvgDotArea(\mu^2)/\pi}}{25.4}$$

Table 12B shows the results for each pulsewidth:

TABLE 12B

| Pulsewidth (μs) | Avg. diameter (Mils) | Energy (mJ) | Avg. Energy Density (J/cm$^2$) | Beam fluence at edge of dot (J/cm$^2$) |
|---|---|---|---|---|
| 800 | 12.8 | 16.48 | 19.85 | 0.08 |
| 700 | 12.8 | 14.48 | 17.45 | 0.07 |
| 600 | 12.8 | 12.48 | 15.04 | 0.06 |
| 500 | 12.2 | 10.48 | 13.90 | 0.10 |
| 400 | 12.4 | 8.48 | 10.89 | 0.07 |
| 300 | 11.4 | 6.47 | 9.83 | 0.15 |
| 200 | 10.2 | 4.45 | 8.45 | 0.35 |
| 100 | 7.3 | 2.27 | 8.40 | 1.96 |
| 50 | 4.6 | 0.68 | 6.35 | 3.76 | where energy is the total energy received by a dot; average energy density is the total energy divided by the dot area;

and beam fluence at edge of dot relates to how much laser energy is applied along the perimeter of the dot (Example 16).

Figure 5:
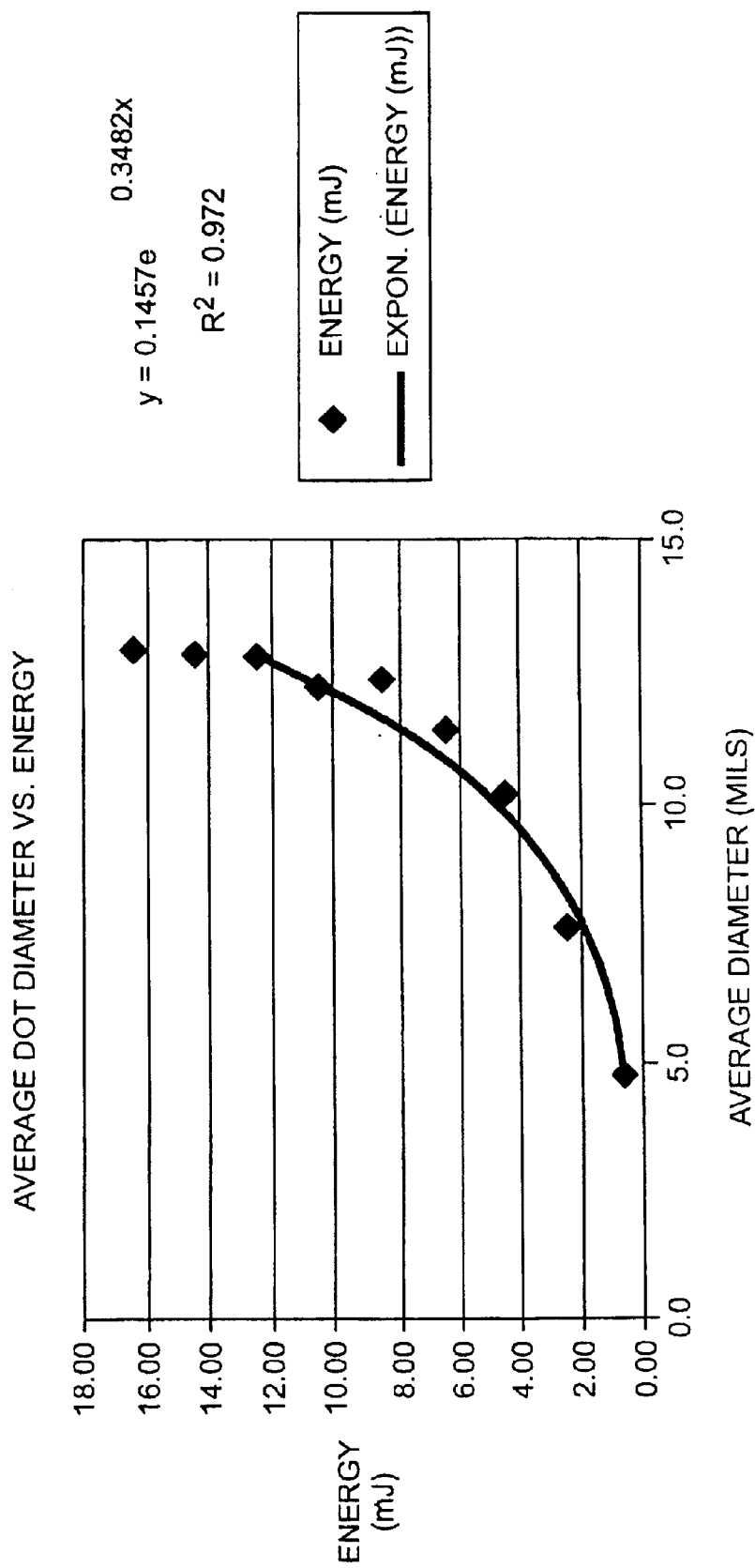
FIG. 5 is a plot of energy (mJ) vs. average diameter (mil)
Figure 6:
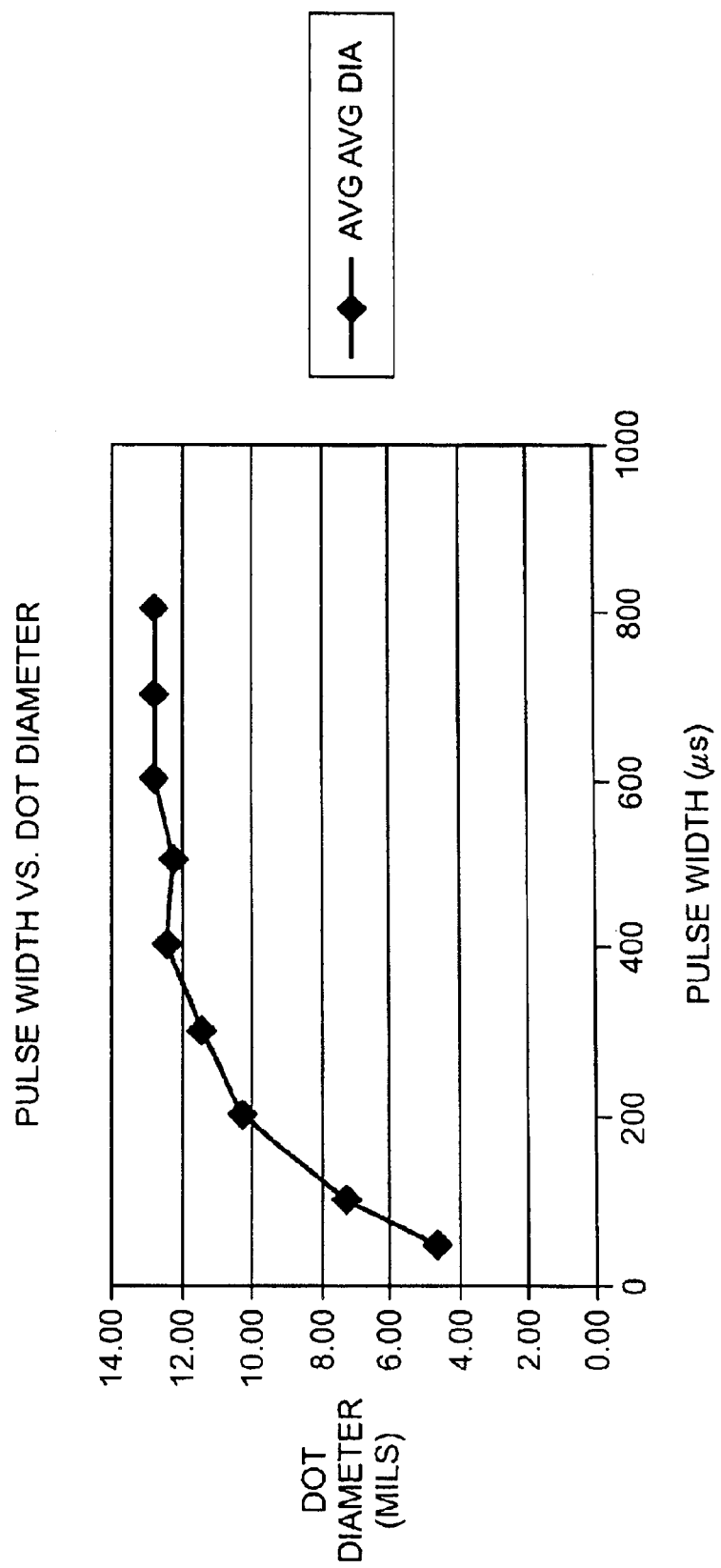
FIG. 6 is a plot of dot diameter (mil) vs. pulse width (microseconds).

FIG. 5 shows energy as a function of average diameter, and FIG. 6 shows dot diameter as a function of pulse width. It appears that for pulse widths greater than about 400 μs, there is little gain in dot area. At about 50 μs pulse width, the data was erratic, and the prints were difficult to read.

EXAMPLE 13

A protocol for heat curing samples is described below.

A coating fluid is applied to substrates using a draw down bar, which helps to provide a uniform coating thickness. The coated substrates are then placed in a wire basket. A layer of aluminum foil is placed on the bottom of the basket to prevent material from dripping onto an oven.

The basket is then placed into the Blue M oven (Model #DC-146C with a Type 0931X019 temperature controller) for a predetermined time and at a predetermined temperature. Typically, the oven temperature decreases when the samples are placed in the oven. The oven temperature, however, recovers relatively quickly. After curing, the basket is removed and cooled to room temperature. Testing is then conducted on the coated substrates.

EXAMPLE 14

The following samples were made to fill in controls for Tables 4A; 5A; 6A; 9A; and 10A.

All samples were drawn down onto 6061 aluminum coupons (1 in.×3 in.) to give a ¼ mil wet film thickness. The coated coupons were placed into a Blue M oven (Model #DC-146C with a Type 0931X019 temperature controller) for 2, 5, and 10 minutes at 200 C. Samples were removed from the oven and addressed with a Domino DDC-2 laser at 300 μs pulse width. A slow moving conveyor belt transported the samples under the laser head. Photographs were then taken of the samples using a microscope (Olympus, Model #SZX12 with Olympus DP10 digital capture). Samples were then crocked and wiped with solvent (Oxsol 100) as described above. Sample D can be used as a control sample for Tables 4A, 5A, and 6A (Sample I without a silane cross linking agent). Sample A can be used as a control sample for Tables 9A and 10A (Sample III only).

TABLE 14A

| Sample | A | B | C | D | E |
|---|---|---|---|---|---|
| Oxsol 100 | 5.00 | 5.00 | 5.00 | 5.00 | 5.00 |
| Dow Corning 4-3136 | 5.00 | 5.00 | 5.00 | 5.00 | 5.00 |
| Tone 0201 |  | 0.50 |  | 0.50 | 0.50 |
| Zinc Octanoate |  |  | 0.25 | 0.25 | 0.25 |
| Silquest A-1100 silane |  |  |  |  | 0.30 |

TABLE 14B

Description of Results

| Time in Oven (Mins) | | A | B | C | D | E |
|---|---|---|---|---|---|---|
| 2 | Before Crock | Black amorphous clouds seen, poor image resolution | Black amorphous clouds seen, poor image resolution | Nice sharp image. | Nice sharp image. | Nice sharp image. |
| | After Crock | Image completely removed-1 stroke | Image completely removed-1 stroke | Some smudging seen, although still very readable | Smudging seen around print. Still readable, although light. | Nice sharp image. No smudging around print. |
| 5 | Before Crock | Black amorphous clouds seen, poor image resolution | Black amorphous clouds seen, poor image resolution | Nice sharp image. | Nice sharp image. | Nice sharp image. |
| | After Crock | Image completely removed-2 strokes | Image completely removed-2 strokes | Only slight smudging around print. Very sharp and readable. | Smudging seen around print. Still readable, although light. Darker than 2 minutes. | Nice sharp image. No smudging around print. |
| 10 | Before Crock | Slightly better definition than 5 mins. Readable image | Nice sharp image. | Nice sharp image. | Nice sharp image. | Nice sharp image. |
| | After Crock | Nearly completely removed after 10X rubs | Image is still readable, although much lighter than before. | No smudging around print, very little removed to | Smudging seen around print. Still readable, although | Nice sharp image. No smudging around print. |

TABLE 14B-continued

Description of Results

| Time in Oven (Mins) | A | B | C | D | E |
|---|---|---|---|---|---|
| | | | cloth. Nice sharp image remains. | light. Darker than 5 minutes. | |

TABLE 14C

Dissolution of Cured Materials

| Time in oven (mins) | A | B | C | D | E |
|---|---|---|---|---|---|
| 2 | Film completely removed | Film completely removed | Film completely removed | Slight film deterioration and removal seen | No film deterioration or removal |
| 5 | Film completely removed | Film completely removed | Slight film deterioration and removal seen | No film deterioration or removal | No film deterioration or removal |
| 10 | Film completely removed | Film completely removed, although slightly less area than 5 minute sample | No film deterioration or removal | No film deterioration or removal | No film deterioration or removal |

Sample E gave good print durability and solvent resistance, e.g., those that can be used for industrial applications. Other samples are useful if cure cycles times greater than 2 minutes at 200° C. are used.

The resin with the combined effects of the polyol, zinc catalyst, and silane create a formula that results in good print durability, rub resistance and chemical resistance when cured for about 2 minutes in a ~200° C. oven.

EXAMPLE 15

An experimental beverage can printing run was performed on cans coated with a composition including 3000 grams of Sample I and 90 grams of the Silquest A-1100 silane. The silane was added to the composition just prior to spraying.

The power of the laser used was as described above. At a pulse width of about 250 microseconds, and a can throughput of about 1250 cans per minute, the cans were marked with an excellent image. The above coating provided a legible print with minimal fracturing and delamination.

EXAMPLE 16

In a Gaussian laser beam, optical power is not uniform throughout the cross-section. The beam has the highest power per unit area at the center of the beam, and the power per unit area deceases away from the center of the beam according to a well-known bell curve. This curve is irradiance, typically expressed in W/cm² and described by the formula:

$$I(r) = \frac{2P}{\pi r_o^2} e^{-2(r/r_o)^2}$$

where r is the distance from the beam center; P is the total beam power; and $r_o$ is the $1/e^2$ radius, i.e., the distance at which the power density is $1/e^2$, about 13% of its peak value.

To calculate how much power an area exposed to the beam sees, one can integrate the irradiance over the area.

The total power delivered to a circular area of radius R is:

$$W = \int_0^{2\pi} \int_0^R I(r) r\, dr\, d\theta = \left[1 - e^{-2(R/r_o)^2}\right] P$$

To find the energy delivered to this area, one can integrate again over exposure time. If the power output of the laser is unchanging—that is, if P is constant—than one multiplies W by the exposure time T. If, however, the laser power is not constant—if P is a function of time—then the energy is:

$$E = \left[1 - e^{-2(R/r_o)^2}\right] \int_0^T P(t)\, dt$$

The power function P(t) of the DDC-2 laser is characterized by an exponential rise to peak power, a dwell at that power, and exponential decay back down to zero. The integration of this profile is known in the art.

Other embodiments are within the claims.

What is claimed is:

1. A method of marking a substrate, the method comprising:
    contacting the substrate with a composition comprising:
        a resin first material comprising a polydiorganosiloxane bearing terminal silanol groups; and a second material capable of extending chains of the first material; and contacting the composition with energy to produce a change in the composition that can be detected optically.

2. The method of claim 1, wherein the second material comprises a polyol.

3. The method of claim 1, further comprising curing the composition.

4. The method of claim 1, wherein the composition further comprises a crosslinking agent.

5. The method of claim 4, wherein the crosslinking agent comprises a silane.

6. The method of claim 1, wherein the substrate is a beverage can.

7. The method of claim 1, wherein contacting the composition with energy comprises forming a marking indicative of a date.

8. The method of claim 1, wherein the energy is delivered from a laser.

9. The method of claim 1, wherein the composition further comprises a blocked crosslinking agent.

10. The method of claim 9, wherein the blocked crosslinking agent is catalytic.

11. The method of claim 9, wherein the blocked crosslinking agent is capable of deblocking to form an amine.

12. The method of claim 9, wherein the blocked crosslinking agent comprises a carbamate.

13. The method of claim 1, wherein the composition further comprises a catalyst.

14. The method of claim 13, wherein the catalyst is selected from a group consisting of a platinum-based catalyst, a zinc-based catalyst, and a Lewis acid.

15. The method of claim 1, wherein the composition further comprises an optical tag.

16. The method of claim 15, wherein the optical tag comprises 2,2'-(2,5-thiophenediyl)bis[5-tert-butylbenzoxazole].

17. The method of claim 1, wherein the resin comprises a combined aromatic and aliphatic substituted silicone resin.

18. The method of claim 1, wherein the resin comprises a phenyl methyl silicone resin.

19. The method of claim 18, wherein the ratio of phenyl to methyl groups of the silicone resin is between about 0.4:1 and 2.1:1.

20. The method of claim 4, wherein the composition comprises about 10 to about 90 percent of the resin, and about 0.1 to about 9 percent of the crosslinking agent.

21. The method of claim 1, wherein the substrate comprises a metal.

22. The method of claim 1, further comprising heating the composition after contacting the composition to the substrate.

23. A method of marking a substrate, the method comprising:

contacting the substrate with a composition comprising:
a first material comprising a phenyl methyl silicone resin, the ratio of phenyl to methyl groups of the silicone resin being between about 0.4:1 and 2.1:1; and contacting the composition with energy to produce a change in the composition that can be detected optically.

24. The method of claim 23, wherein the energy is delivered from a laser.

25. A method of marking a substrate, the method comprising:

contacting the substrate with a composition comprising:
a first material comprising a phenyl methyl silicone resin, the ratio of phenyl to methyl groups of the silicone resin being between about 0.4:1 and 2.1:1; and contacting the composition with energy to produce a change in the composition that can be detected optically, wherein the composition further comprises a crosslinking agent.

26. The method of claim 25, wherein the crosslinking agent is blocked.

27. The method of claim 25, wherein the crosslinking agent is catalytic.

28. The method of claim 25, wherein the crosslinking agent is blocked.

29. The method of claim 28, wherein the crosslinking agent is capable of deblocking to form an amine.

30. The method of claim 28, wherein the crosslinking agent comprises a carbamate.

31. The method of claim 25, wherein the composition comprises about 10 to about 90 percent of the resin, and about 0.1 to about 9 percent of the crosslinking agent.

32. A method of marking a substrate, the method comprising:

contacting the substrate with a composition comprising:
a first material comprising a phenyl methyl silicone resin, the ratio of phenyl to methyl groups of the silicone resin being between about 0.4:1 and 2.1:1; and contacting the composition with energy to produce a change in the composition that can be detected optically, wherein the crosslinking agent comprises a silane.

33. The method of claim 32, wherein the composition comprises about 10 to about 90 percent of the resin, and about 0.1 to about 9 percent of the crosslinking agent.

34. A method of marking a substrate, the method comprising:

contacting the substrate with a composition comprising:
a first material comprising a phenyl methyl silicone resin, the ratio of phenyl to methyl groups of the silicone resin being between about 0.4:1 and 2.1:1; and contacting the composition with energy to produce a change in the composition that can be detected optically, wherein the composition further comprises a polyol.

35. The method of claim 34, wherein the polyol comprises a diol or a triol.

36. A method of marking a substrate, the method comprising:

contacting the substrate with a composition comprising:
a first material comprising a phenyl methyl silicone resin, the ratio of phenyl to methyl groups of the silicone resin being between about 0.4:1 and 2.1:1; and contacting the composition with energy to produce a change in the composition that can be detected optically, wherein the composition further comprises a catalyst.

37. The method of claim 36, wherein the catalyst is selected from the group consisting of a platinum-based catalyst, a zinc-based catalyst, and a Lewis acid.

* * * * *